United States Patent
Findley et al.

(10) Patent No.: US 6,972,658 B1
(45) Date of Patent: Dec. 6, 2005

(54) DIFFERENTIAL INDUCTOR DESIGN FOR HIGH SELF-RESONANCE FREQUENCY

(75) Inventors: Paul Findley, Cupertino, CA (US); Jon Tao, Fremont, CA (US); Gholam-Ali Rezvani, San Jose, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 73 days.

(21) Appl. No.: 10/704,869

(22) Filed: Nov. 10, 2003

(51) Int. Cl.[7] .............................................. H01F 5/00
(52) U.S. Cl. ..................................... 336/200; 257/531
(58) Field of Search ........................ 336/83, 200, 232; 257/531

(56) References Cited

U.S. PATENT DOCUMENTS

| | | | | |
|---|---|---|---|---|
| 4,816,784 A | * | 3/1989 | Rabjohn | 333/24 R |
| 5,420,558 A | * | 5/1995 | Ito et al. | 336/200 |
| 5,548,265 A | * | 8/1996 | Saito | 336/200 |
| 5,629,648 A | | 5/1997 | Pratt | 330/289 |
| 5,781,071 A | * | 7/1998 | Kusunoki | 330/269 |
| 6,313,705 B1 | | 11/2001 | Dening et al. | 330/276 |
| 6,333,677 B1 | | 12/2001 | Dening | 330/296 |
| 6,369,657 B2 | | 4/2002 | Dening et al. | 330/296 |
| 6,404,287 B2 | | 6/2002 | Dening et al. | 330/296 |
| 6,420,773 B1 | * | 7/2002 | Liou | 257/531 |
| 6,566,963 B1 | | 5/2003 | Yan et al. | 330/311 |
| 6,606,489 B2 | | 8/2003 | Razavi et al. | 455/323 |
| 6,608,367 B1 | | 8/2003 | Gibson et al. | 257/666 |
| 6,621,140 B1 | | 9/2003 | Gibson et al. | 257/531 |
| 6,658,265 B1 | | 12/2003 | Steel et al. | 455/553.1 |

* cited by examiner

Primary Examiner—Tuyen T Nguyen
(74) Attorney, Agent, or Firm—Withrow & Terranova, PLLC

(57) ABSTRACT

A differential inductor is formed from branch coils that are staggered with respect to one another rather than concentrically coiled within one another. Each coil is formed from conductive strips. The conductive strips with the largest voltage swings thereon are shielded from one another by conductive strips with lower voltage swings thereon. This shielding allows the effective capacitance of the differential inductor to be lowered, which in turn raises the range of frequencies at which the differential inductor can operate.

17 Claims, 7 Drawing Sheets

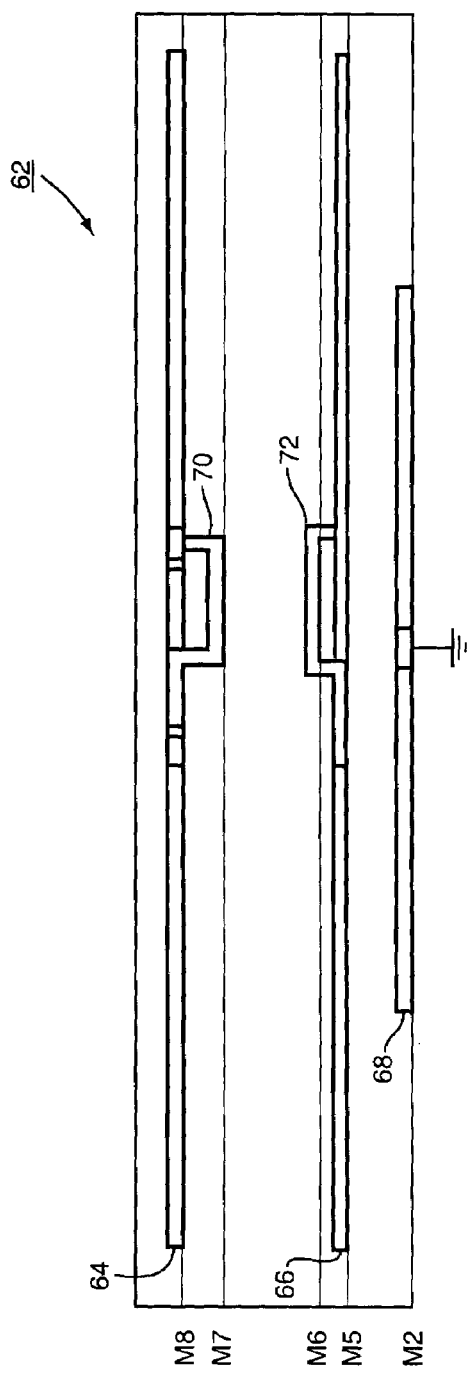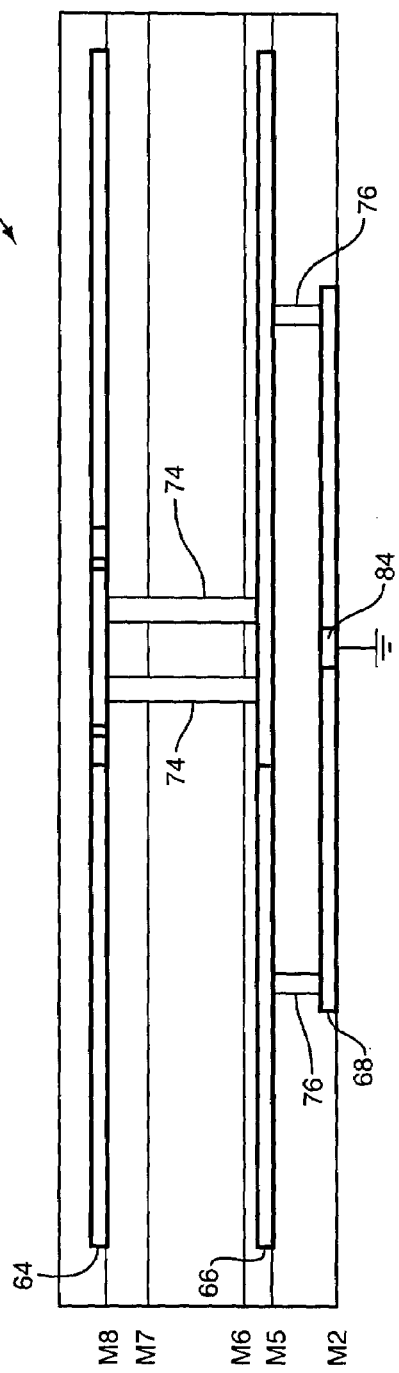
FIG. 4A
FIG. 4B

DIFFERENTIAL INDUCTOR DESIGN FOR HIGH SELF-RESONANCE FREQUENCY

FIELD OF THE INVENTION

The present invention is directed to an improved design for differential inductors that has a high self-resonance frequency.

BACKGROUND OF THE INVENTION

As of this writing, wireless devices have become ubiquitous in American society. Pagers, cellular telephones, personal digital assistants and the like (collectively "mobile terminals") can be found in home and business environments. Likewise, the availability of affordable wireless routers has caused a surge in the number of wireless local area networks. Common to most of these devices are wireless transmitters and receivers. In these wireless transmitters and receivers, it is common to have an on-chip voltage controlled oscillator (VCO), a tuned amplifier, a power amplifier, or an up-conversion mixer amidst the electronic components that form such devices. These elements typically rely on inductors for at least part of their functionality.

As mobile terminals become more common, the various communication industries have perceived that the public believes that smaller is better when it comes to mobile terminals. As a result, there is an industry-wide effort to miniaturize components within mobile terminals. Some components are inherently difficult to miniaturize. One such component that resists miniaturization is an inductor, which, as noted, can be present in a VCO, a tuned amplifier, a power amplifier, or an up-conversion mixer. An early effort to create smaller inductors was the use of a differential inductor.

A differential inductor is a special case of an inductor, which is physically designed for symmetry or near-symmetry between its two ends (i.e., a "symmetric" inductor), in which the two ends are used as inputs for AC signals that are out of phase. In this document, the term "differential inductor" is used as a synonym for "symmetric inductor" with regard to purely physical design properties, as well as being used in its usual sense of defining a driving condition for the inductor's inputs. Specifically excluded from the definition of "differential inductor" are two separate, non-intertwined inductors which happen to be symmetric with respect to each other (usually mirrored) and/or happen to be differentially driven. While the literature sometimes refers to such a driven pair of inductors as a differential inductor, for the purposes of this document, such an inductor is referred to herein as a differentially driven pair of inductors.

Differential inductors are typically laid out with overlapping, oppositely wound (with respect to the respective inputs) coils containing one or more loops. The oppositely wound coils effectively almost double the inductance of the element in approximately the same space that a single coil inductor would occupy. The oppositely wound coils of the differential inductor position oppositely charging loops next to each other. This positioning creates a large effective capacitance ($C_{EFF}$) within the differential inductor. This effective capacitance lowers the self-resonance frequency ($F_{SR}$) of the differential inductor according to $2\pi F_{SR} = 1/\sqrt{(LC_{EFF})}$, where L is the total inductance of one differential branch, in effect limiting the frequency range over which the differential inductor can operate.

To address this limited operating range, conventional circuit design spreads the loops of the inductor farther apart; however, this has at least two disadvantages. First, spreading the loops consumes more space, which, as already mentioned, is at a premium in mobile terminals. Second, when the loops are spread apart, the magnetic coupling of the loops decreases, so that the inductor has a lower inductance. This lower inductance is offset by adding windings, which also takes up more space. Thus, there is a need for an improved differential inductor that does not take up excessive amounts of space within the mobile terminal.

SUMMARY OF THE INVENTION

The present invention provides an improved differential inductor that furthers the goals of miniaturization. While the differential inductor of the present invention is well-suited for use in a mobile terminal, it is also useful in any device that has a differential inductor or two differentially driven inductors (usually matched by mirroring to be symmetric about an axis) which can be replaced by the differential inductor of the present invention.

The present invention winds the coils of a differential inductor to provide partial electrical shielding between the two branches by staggering the branches with respect to one another. The staggering causes the portions of the loops of the coil with the most voltage swing thereon to be positioned proximate portions that are close to ground and thus have little or no voltage swing. This positioning lowers the effective capacitance of the differential inductor and allows for a higher self-resonance frequency. This in turn allows for a broader range of operating frequencies. In effect, the present invention shields those portions of the differential inductor that are highly positive or highly negative from one another by positioning portions of the differential inductor that are close to ground therebetween.

The mitigation of the effective capacitance is accomplished with little or no sacrifice in magnetic coupling. In this regard, this invention is based on the fact that effective capacitance is dependent on charge and voltage swings of electrically coupled elements, while mutual inductance is dependent on electric current through magnetically coupled elements. The mutual inductance is desirable when the current winds in the same sense (e.g., clockwise or counterclockwise) under the differential driving condition. This invention tends to conserve the totality of desirable couplings of current segments relative to the conventional implementations, while reducing the capacitive coupling of the oppositely driven branches of the differential inductor. Only the totality of the desirable magnetic couplings of current carrying segments is important to the total effective inductance of a branch, and not the segments' identification with one branch or the other. Thus, as the structure is staggered to minimize the effective capacitance, the magnetic coupling in totality is preserved, because for every segment that is moved away for effective capacitance reasons, another segment takes its place with the same spacing and sense of current direction, effectively preserving the total inductance.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 4A illustrates a side view of a third embodiment, wherein the differential inductor has more than two layers and the overpasses and underpasses are highlighted;

FIG. 4B illustrates a second side view of the third embodiment, wherein the vias connecting the various layers are highlighted;

DETAILED DESCRIPTION OF THE PREFERRED EMBODIMENTS

Figure 1:
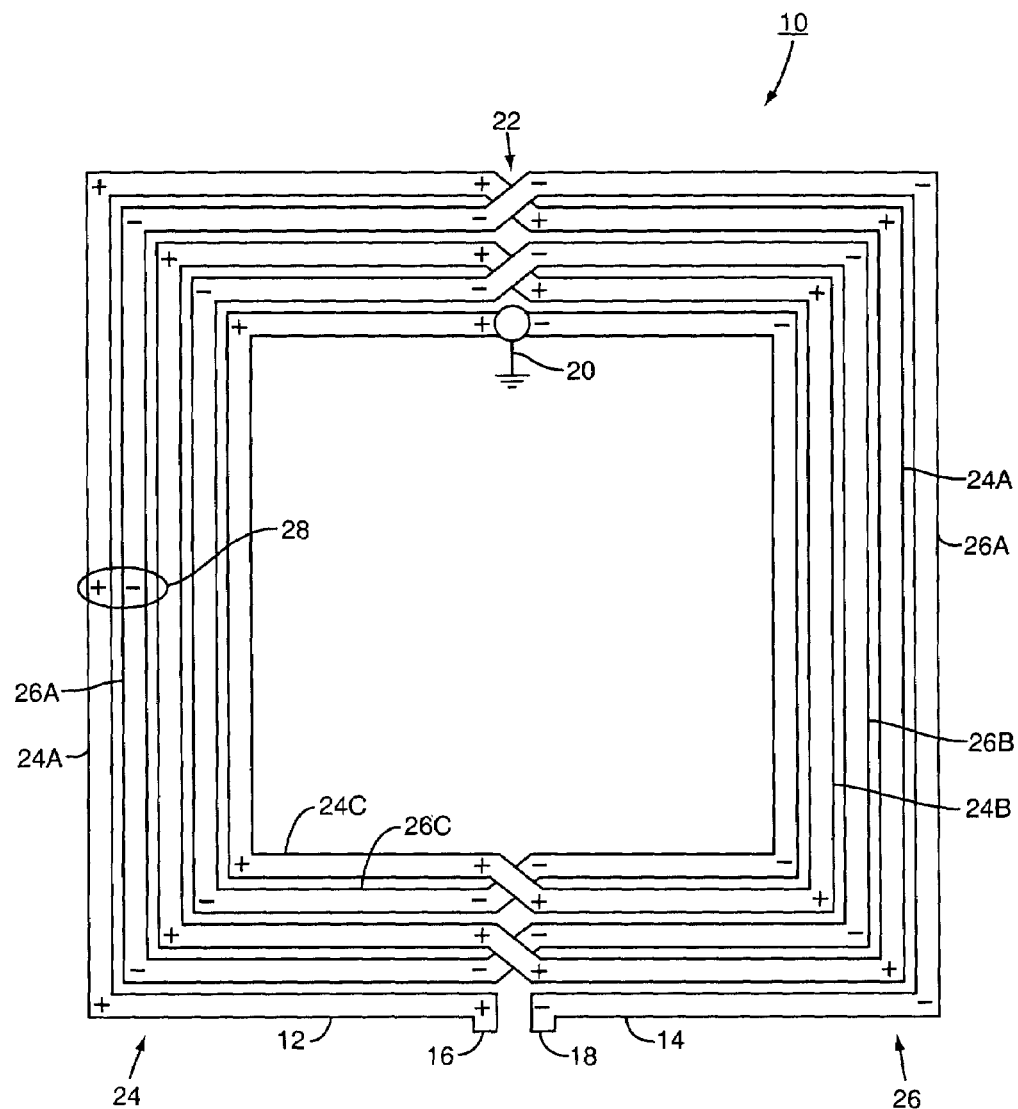
FIG. 1 illustrates a conventional differential inductor with oppositely wound coils.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is an improved differential inductor suitable for use in an on-chip voltage controlled oscillator (VCO), a tuned amplifier, a power amplifier, an up-conversion mixer or similar electronic component that uses a differential inductor and for which there are demands to conserve space. However, the present invention is not limited to such environments and can be used in any environment in which an inductor is used. The present invention functions by providing staggered or offset inductive coils. The staggered coils create shielding between the portions of the coils that are highly positive or highly negative by positioning portions of coils that are electrically of similar polarity and/or closer to ground therebetween. Before explaining the present invention, a brief review of a conventional differential inductor is provided. The discussion of the present invention begins with reference to FIG. 2 below.

While inductors are generally understood in the industry, for the sake of clarity in the present invention, a few common terms are specifically defined. A "coil" is formed from one or more loops and extends from a feed point to ground. A "loop" is something having a shape that is generally circular or curved over on itself. This definition is meant to include non-traditional loop shapes such as squares, hexagons, octagons, and the like, all of which can be interpreted to curve over on themselves. In the present invention, loops are made from one or more conductive strips. The conductive strips may be linear or curved as needed or desired depending on the ultimate shape of the loop they form.

A few additional comments are in order. With regard to the use of + and − signs in the figures, these are used to represent relative phase or polarity of the driving attribute, and are not meant to denote absolute signal direction. When the signals applied to the symmetric inputs are out of phase ("drive"), two symmetric points labeled + and − will be out of phase while two non-symmetric points labeled + and − will have opposite polarity about ground, but will not be perfectly out of phase.

In most places in the present description, the concept of relative "charge" states may be replaced with the concept of relative signal states. The driving condition is usually supplied by a voltage or current controlling device, while the charge is not directly controlled. Nevertheless, the present description uses "charge," which in general tracks the signal state, as the appropriate conceptual descriptor.

A conventional differential inductor 10 is illustrated in FIG. 1. The differential inductor 10 includes a positive coil 12 and a negative coil 14. The coils 12, 14 travel from feed points 16, 18, respectively, to a common ground 20. The coils 12, 14 are generally formed from a conductive material or materials such as aluminum, copper, gold, tungsten, platinum or the like and are separated where they cross (indicated generally at 22) by some form of oxide, such as a silicon oxide, or some other insulative material as is well understood. The coils 12, 14 travel in opposite directions from their respective feed points to the common ground 20. In the embodiment illustrated, the positive coil 12 travels inwardly in a clockwise direction and the negative coil 14 travels inwardly in a counter-clockwise direction. Each coil 12, 14 is formed from a series of concentric loops 24, 26, respectively. As illustrated, positive coil 12 has outer loop 24A, middle loop 24B, and inner loop 24C. Likewise, negative coil 14 has outer loop 26A, middle loop 26B, and inner loop 26C.

As is well understood, outer loops 24A, 26A are electrically distant from common ground 20 and thus have a relatively large voltage swing thereon, especially in comparison to inner loops 24C, 26C, which are electrically close to common ground 20.

As seen by the location generally marked by circle 28, loops 24A, 26A are positioned in a horizontal plane in very close proximity. Because loops 24A, 26A are electrically distant from common ground 20 and have large voltage swings thereon, a large effective capacitance is created therebetween. This effective capacitance lowers the self resonance frequency of the differential inductor 10, which in turn lowers the effective operating frequency range of the differential inductor 10.

Figure 2:
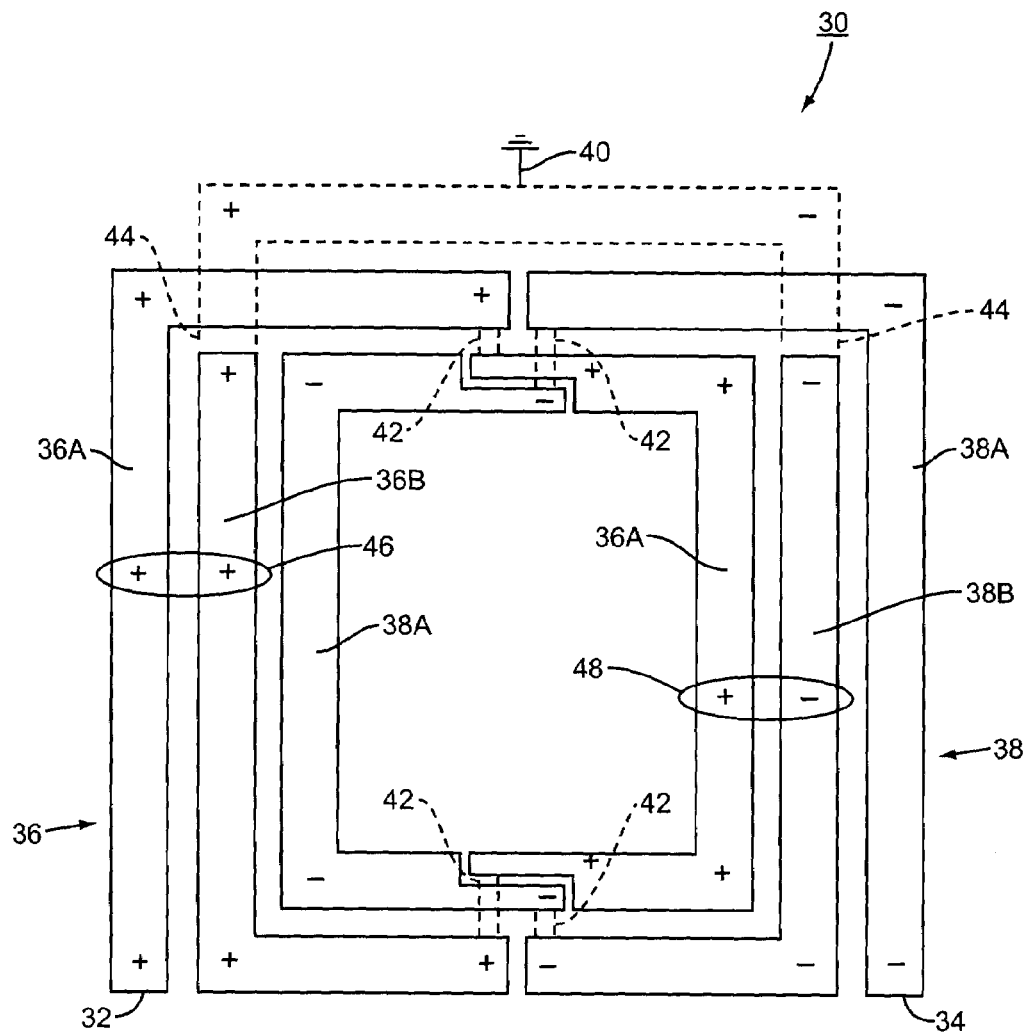
FIG. 2 illustrates a first embodiment of the differential inductor of the present invention.

The present invention spaces the conductive strips that have large oppositely charged voltage swings from one another, and through this spacing reduces the effective capacitance of the differential inductor. A first embodiment of this is seen in FIG. 2. Specifically, a differential inductor 30 is illustrated. The differential inductor 30 includes a positive coil 32 and a negative coil 34. Coils 32, 34 travel in loops 36, 38, respectively, to a common ground 40 in a non-conventional arrangement. Positive coil 32 has a first loop 36A, and a partial second loop 36B. Likewise, negative coil 34 has a first loop 38A, and a partial second loop 38B. Where the coils 32, 34 cross one another, an underpass 42 is formed. This underpass may be formed through the use of an alternate level of metal with interconnecting vias or other forms of fill, through an insulative material as is well understood. While underpasses are shown, it is also contemplated that an equivalent overpass could also be used. Grounding underpasses 44 connect the coils 32, 34 to the common ground 40 as illustrated.

As noted above, the further from the common ground 40, the larger the voltage swings present on the conductive strips forming the loops. The present invention positions similarly charged portions of the coils 32, 34 proximate to one another. Thus, at circle 46, first loop 36A is positioned proximate partial second loop 36B. It should be appreciated that the effective capacitance contributed by similar polarity neighbors is small, because of the small relative voltage swing therebetween. Where oppositely charged strips are positioned proximate one another, the present invention helps alleviate the effective capacitance by making sure that at least one of the conductive strips is electrically close to the common ground 40. Thus, for example, at circle 48, first loop 36A is beside partial second loop 38B. Partial second loop 38B is of opposite polarity relative to first loop 36A and is close to the common ground 40, and thus, does not experience large voltage swings. Since partial second loop 38B does not experience large voltage swings, the effective capacitance between first loop 36A and partial second loop 38B is less than would be found in a conventional system. Another way of looking at the present invention is that lines that have large voltage swings thereon are spaced away from oppositely charged lines. For example, first outer loop 36A, which is electrically distant from the common ground 40 and thus has large voltage swings thereon, is spaced from oppositely charged first outer loop 38A by intervening similar-polarity loop 36B on the left side of the Figure and by intervening opposite-polarity, but close-to-ground, partial second loop loop 38B, on the right side of the Figure. In this manner, the effective capacitance is reduced.

Figure 3:
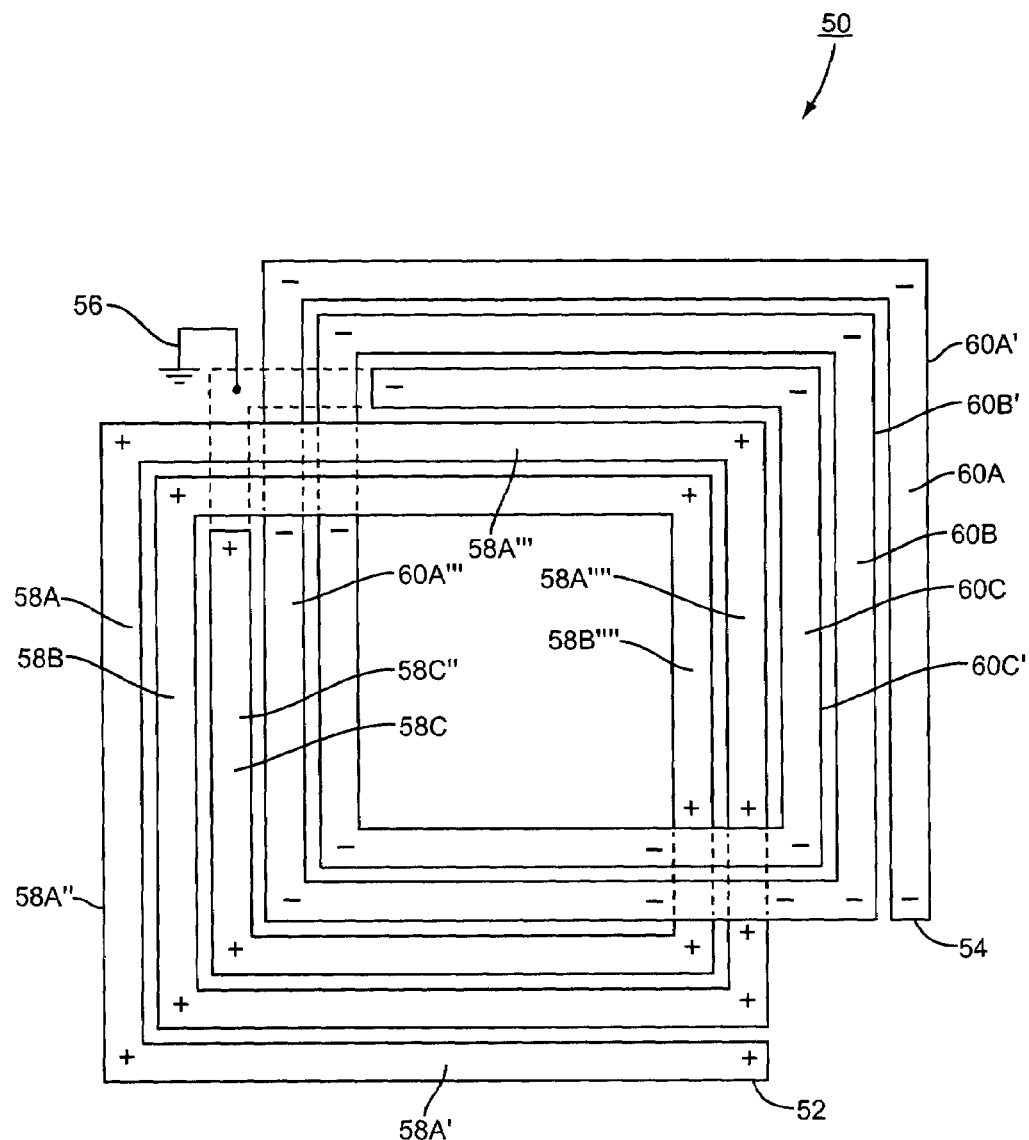
FIG. 3 illustrates a second embodiment of the differential inductor of the present invention.
Figure 5:
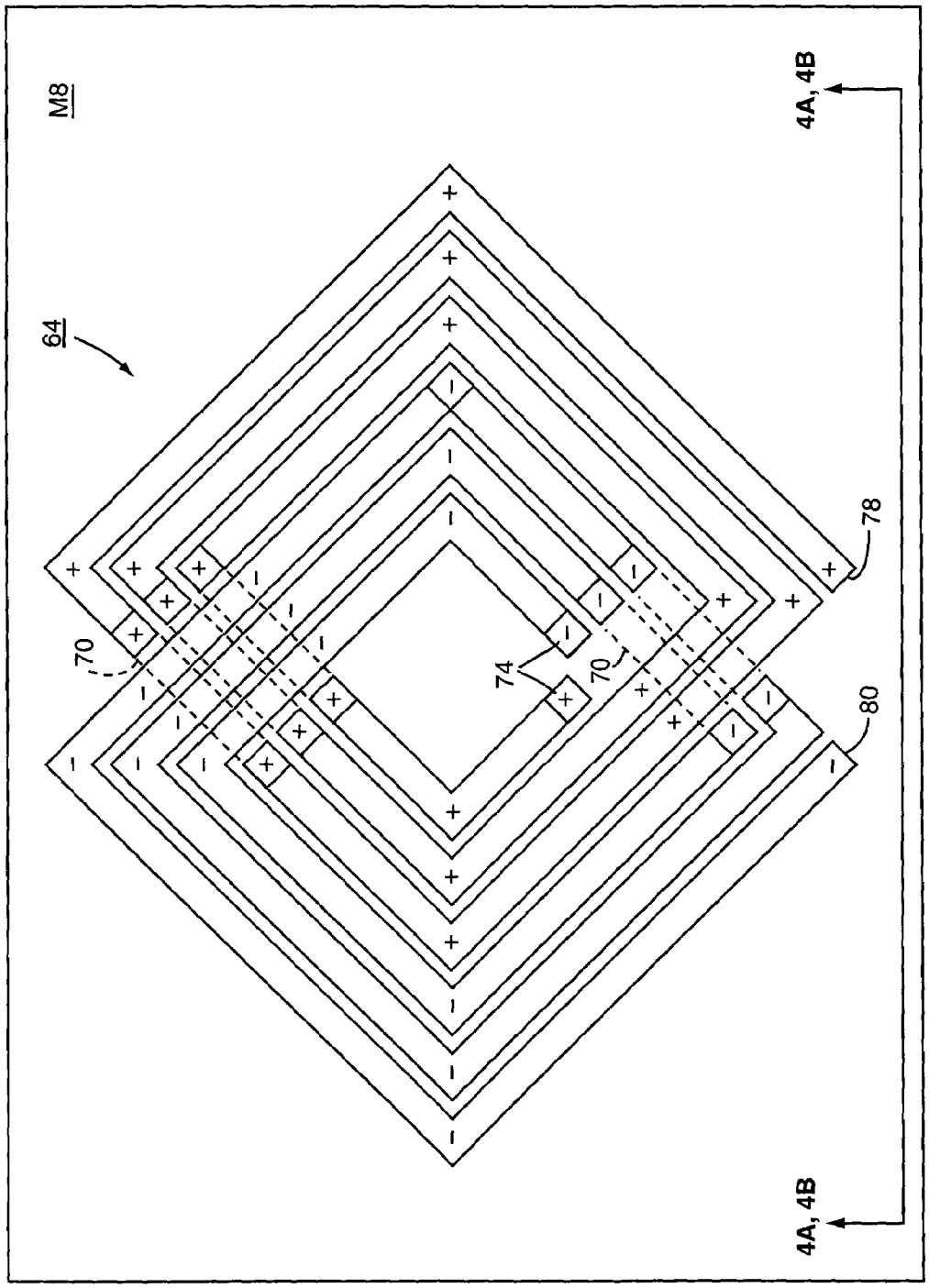
FIG. 5 illustrates a top layer of the embodiment of FIGS. 4A and 4B.

The preferred embodiment of the principle initially explored in FIG. 2 is illustrated in FIG. 3. In the embodiment of FIG. 3, a differential inductor 50 is shown. Differential inductor 50 is formed from positive coil 52 and negative coil 54. Coils 52, 54 are staggered with respect to one another and wound in opposite directions. Coils 52, 54 terminate at common ground 56.

In this embodiment, positive coil 52 is formed from an outer loop 58A, a middle loop 58B, and an inner loop 58C. Each loop is formed from one or more conductive strips, such as 58A', 58A'', 58A''', and 58A''''. Negative coil 54 is formed from an outer loop 60A, a middle loop 60B, and an inner loop 60C.

As is readily seen, the outer loops 58A, 60A are spaced from one another by middle and inner loops. As a specific example, conductive strip 58A'' is spaced from conductive strip 60A'' by middle loop 58B and inner loop 58C, while conductive strip 60A' is spaced from conductive strip 58A'''' by middle loop 60B and inner loop 60C. Inner coils 58C and 60C are electrically close to the common ground 56 and thus have low voltage swings. In contrast, the outer coils 58A and 60A are electrically distant from the common ground 56 and thus have large voltage swings. However, the staggered position of the present invention causes these large voltage swings to be spaced away from one another, which reduces the effective capacitance of the differential inductor 50. Even where an outer coil 58A or 60A is close to an oppositely charged coil (such as 60A''' and 58C''), one of the conductive strips will be electrically close to the common ground 56 and thus will not create a large effective capacitance therebetween.

In short, the present invention is designed around the concept that strongly oppositely charged conductive strips should not be near neighbors, and in the preferred embodiment, that near neighbors should be of as similar polarity as possible (i.e., sign and magnitude). In the event that near neighbors cannot be of a similar sign and magnitude, then at least one of the near neighbors should be electrically close to ground. Strongly charged segments are those conductive strips that are electrically distant from the ground, such as those that can be found near the feed points or in the outer loops 58A, 60A. Weakly charged conductive strips are those conductive strips that are electrically proximate to the ground, such as those found in inner loops 58C, 60C. Near neighbors are those conductive strips that are next to one another such as 58A''' and 58B'''' or 60A''' and 58C''. If a conductive strip is interposed between two conductive strips, then the conductive strips on either side of the interposing conductive strip are not near neighbors (for example, conductive strip 58A'''' is not a near neighbor to conductive strip 60B' because conductive strip 60C' is interposed therebetween).

By spacing the portions of the differential inductor 50 that have high voltage swings, not only is the effective capacitance lowered, but the Q of the differential inductor is raised and the operating frequency range of the differential inductor 50 is likewise increased.

When constructing a differential inductor according to the present invention, it is preferred that the inductor be symmetrical about the ground point. However, this leaves plenty of room for variation in the structure as evidenced by the differences between the embodiment of FIG. 2 and FIG. 3. Likewise, while the differential inductors 30, 50 are shown with the coils positioned parallel to the edges of the paper, it should be appreciated that with respect to a board on which they are mounted, the edges may be rotated forty-five degrees or as needed or desired so that the mounting may be correct for practical hook up on an orthogonal grid.

Additionally, while the differential inductors 30, 50 are shown with two and three loops, respectively, it should be appreciated that the number of loops can be varied as needed to achieve a desired inductance in the differential inductor. Likewise, while a square loop is shown, it is possible, although not necessarily desired to have a rectangular, hexagonal, octagonal, circular, or the like loop. In such a circumstance, the staggering remains the same, but the geometries of the loops change slightly.

Another embodiment is illustrated in remaining FIGS. 4A–7 wherein a multilayer differential inductor 62 is illustrated. A multilayer differential inductor may be used to create higher inductances than may be available with a single layer differential inductor such as the embodiment of FIG. 3. For example, the embodiment of FIGS. 4A–7 has been made with an inductance of 10 nH whereas the embodiment of FIG. 3 has been made with an inductance of 3.6 nH. The differential inductor 62 is made by positioning coils on different metal layers within a multi-layer substrate or die. In an exemplary embodiment, metal 1 to metal 8 (M1–M8) are conventional metal layers within a multi-layer substrate or die, and the layers may be positioned thereon as is further explained below.

As illustrated in FIGS. 4A and 4B, there are three main layers, including: a top layer 64, a middle layer 66, and a bottom layer 68. Top layer 64 is primarily positioned on metal 8 (M8) with underpasses 70 (FIG. 4A) positioned on metal 7 (M7). Middle layer 66 is primarily positioned on metal 5 (M5) with overpasses 72 on metal 6 (M6). Metal vias 74 (FIG. 4B) drop from M8 to M5 to connect the top layer 64 to the middle layer 66. Bottom layer 68 is primarily positioned on metal 2 (M2). Metal vias 76 connect middle layer 66 to bottom layer 68.

Figure 6:
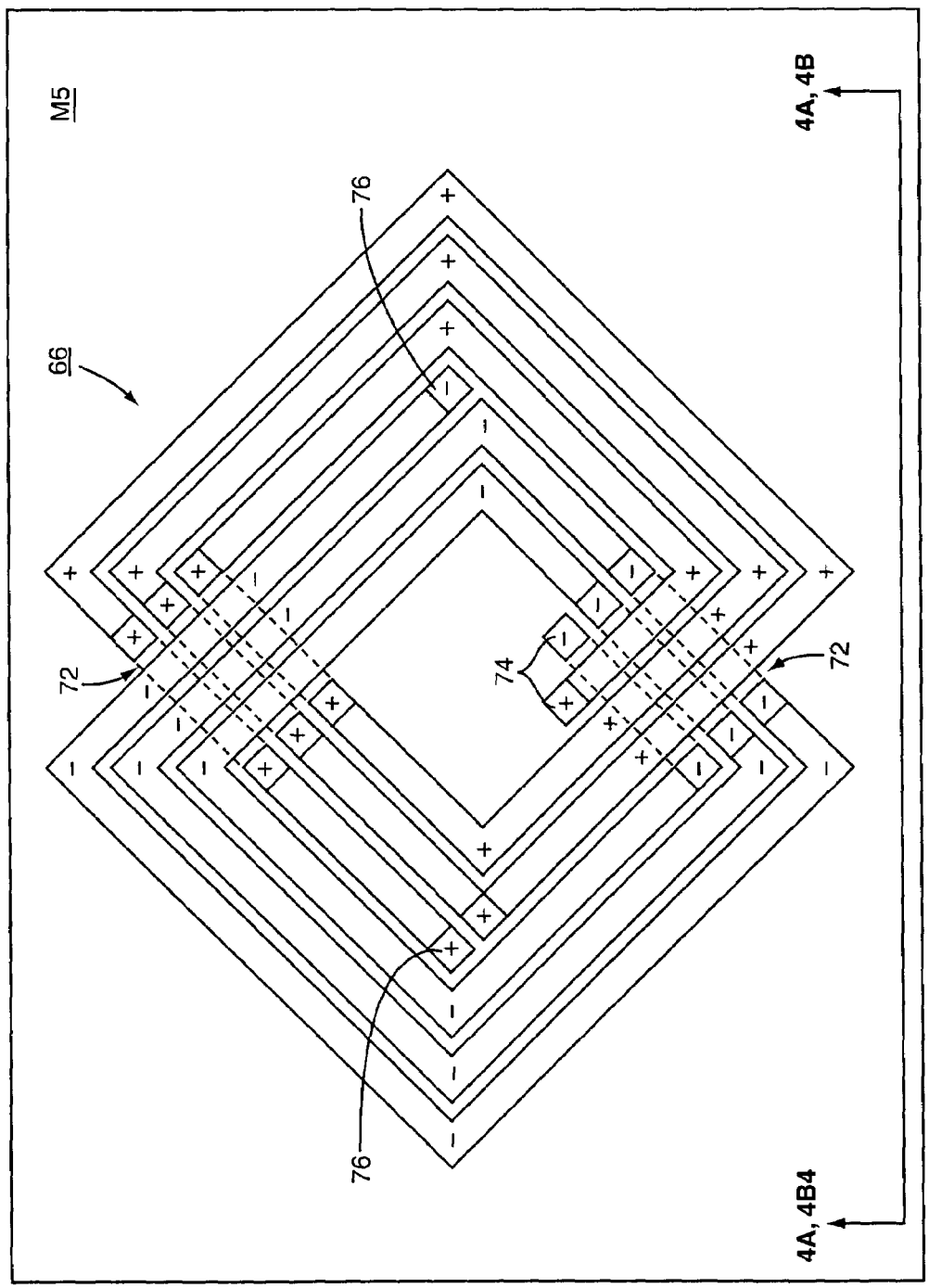
FIG. 6 illustrates a middle layer of the embodiment of FIGS. 4A and 4B.
Figure 7:
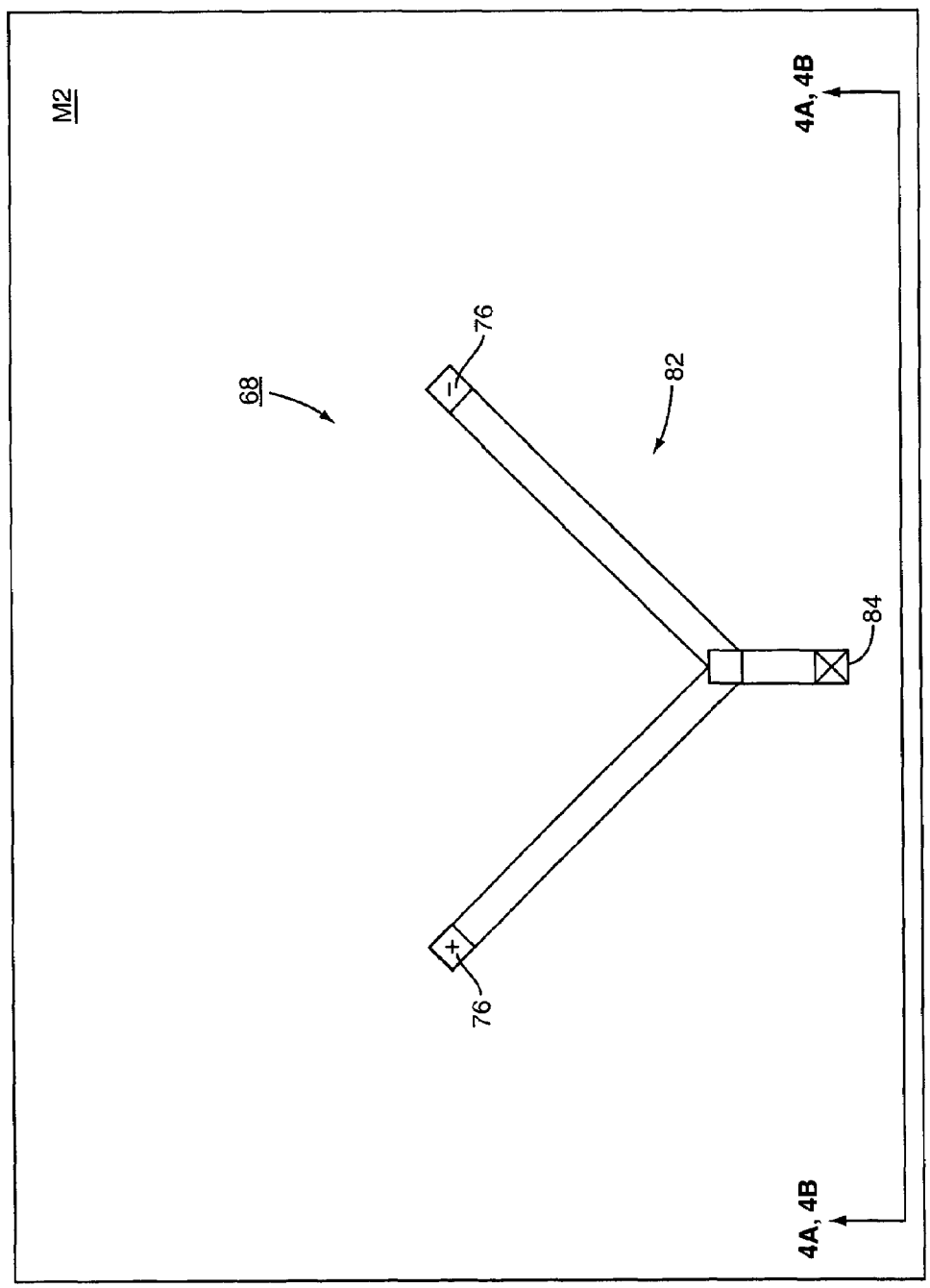
FIG. 7 illustrates a bottom layer of the embodiment of FIGS. 4A and 4B.

The embodiment of FIGS. 4A–7 follows the same principles that were described above, wherein conductive strips with large voltage swings are separated from one another and shielded from one another by conductive strips with lower voltage swings. This helps reduce the effective capacitance of the inductor. Points 78, 80 (FIG. 5) represent the feed points of the differential inductor 62. The coils wind inwardly until they reach the metal vias 74 which drop down to the middle layer 66 (FIG. 6). The middle layer 66 has coils which keep winding in the same direction until they reach the metal vias 76. Metal vias 76 drop down to the bottom layer 68 (FIG. 7), which has a Y-shaped conductor 82. The Y-shaped conductor 82 connects to a ground at the leg of the Y, point 84. The Y-shape provides a point of symmetry between the two branches of the differential inductor 62. Note that in this embodiment, the lateral near neighbors, as well as the vertical near neighbors, are of similar polarity. Thus, the term "near neighbors" is used herein to describe lateral and vertical positionings.

Additionally, strapping may be used in layers metal 4 and metal 1 (omitted from drawings for conciseness) so that the conductive strips have a lower resistance. Because M8 is typically very thick, and the other layers M1–M7 are thinner, strapping can be used to achieve the same resistance, as is well understood in the industry. As this is an implementation detail not critical to practicing the invention, it is not shown explicitly.

Again, while squares coils are illustrated, it should be appreciated that other geometries may also be used, such as hexagons, octagons, circles, and the like.

With reference to the grounding of the center point or point of symmetry of the differential inductor, this may be an explicit, connected ground, or a virtual ground by virtue of the differential driving condition. The more exact the symmetry of the physical design and the more exact the out-of-phase driving condition, the more perfect would be the virtual ground at the center point. In practical implementations where the symmetry (especially the physical symmetry) is not exact, the virtual ground point is not stationary, and stability is achieved in usual practice by physically grounding the approximate point of symmetry.

The advantages cited herein will reduce effective capacitance whenever the signals are of opposite polarity, even if not exactly "differential," and it is intended that implementations in such applications are also within the scope of the present invention.

Those skilled in the art will recognize improvements and modifications to the preferred embodiments of the present invention. All such improvements and modifications are considered within the scope of the concepts disclosed herein and the claims that follow.

What is claimed is:

1. A differential inductor adapted to be positioned within a substrate, comprising:
   a common ground;
   a first coil electrically connected to said common ground, said first coil comprising a first close portion that is electrically close to said common ground and a first distant portion which is electrically distant from said common ground; and
   a second coil electrically connected to said common ground, said second coil comprising a second close portion that is electrically close to said common ground and a second distant portion which is electrically distant from said common ground;
   said first coil staggered with respect to said second coil such that said first distant portion is separated from said second distant portion by at least one of said first and second close portions being interposed therebetween.

2. The differential inductor of claim 1 wherein said first and second coils are symmetrically arranged around said common ground.

3. The differential inductor of claim 1 wherein said first coil comprises a first feed point and said second coil comprises a second feed point.

4. The differential inductor of claim 1 wherein portions of said first coil and said second coil that are electrically equally distant from said common ground are not near neighbors.

5. The differential inductor of claim 1 wherein said portions that are electrically close to ground shield said portions that are electrically distant from ground from one another by being positioned therebetween.

6. The differential inductor of claim 1 further comprising a third coil electrically connected to said first coil.

7. The differential inductor of claim 6 further comprising a fourth coil electrically connected to said second coil, said fourth coil staggered relative to said third coil.

8. The differential inductor of claim 7 wherein said third and fourth coils are positioned on a layer other than a layer on which said first and second coils are positioned.

9. The differential inductor of claim 8 further comprising a third layer on which a Y-shaped conductor is positioned to connect said third and fourth coils to said common ground.

10. A differential inductor comprising:
    a first coil comprising a first inner loop and a first outer loop;
    a second coil comprising a second inner loop and a second outer loop; and
    a common ground point, said first and second inner loops electrically connected to said common ground point;
    said first outer loop spaced from said second outer loop at all points by at least one of said first and second inner loops.

11. The differential inductor of claim 10 wherein said first coil further comprises a first middle loop positioned between said first inner loop and said first outer loop.

12. The differential inductor of claim 11 wherein said second coil further comprises a second middle loop positioned between said second inner loop and said second outer loop.

13. The differential inductor of claim 10 wherein said first and second coils are formed in the shape of squares.

14. The differential inductor of claim 10 wherein said first and second inner loops act as shields between said first and second outer loops to reduce an effective capacitance created by said differential inductor.

15. A differential inductor comprising:
    a first coil comprising a first inner loop and a first outer loop, said first coil positioned on a first layer;
    a second coil comprising a second inner loop and a second outer loop, said second coil positioned on said first layer;
    a third coil comprising a third inner loop and a third outer loop; said third coil electrically connected to said first coil and positioned on a second layer;
    a fourth coil comprising a fourth inner loop and a fourth outer loop, said fourth coil positioned on said second layer;
    a common ground point, said first and second inner loops electrically connected to said common ground point through said third and fourth coils respectively;
    said first outer loop spaced from said second outer loop at all points by at least one of said first and second inner loops.

16. The differential inductor of claim 15 wherein said third outer loop is spaced from said fourth outer loop at all points by at least one of said third and fourth inner loops.

17. The differential inductor of claim 15 further comprising a Y-shaped conductor connecting said third and fourth coils to said common ground, said Y-shaped conductor positioned on a third layer.

* * * * *